(12) United States Patent
Zhu et al.

(10) Patent No.: US 9,397,104 B2
(45) Date of Patent: Jul. 19, 2016

(54) SRAM CELL AND METHOD FOR MANUFACTURING THE SAME

(75) Inventors: Huilong Zhu, Poughkeepsie, NY (US); Qingqing Liang, Lagrangeville, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 696 days.

(21) Appl. No.: 13/509,891

(22) PCT Filed: Nov. 23, 2011

(86) PCT No.: PCT/CN2011/082700
§ 371 (c)(1),
(2), (4) Date: May 15, 2012

(87) PCT Pub. No.: WO2013/040835
PCT Pub. Date: Mar. 28, 2013

(65) Prior Publication Data
US 2013/0069112 A1   Mar. 21, 2013

(30) Foreign Application Priority Data
Sep. 21, 2011  (CN) .......................... 2011 1 0281517

(51) Int. Cl.
*H01L 21/70*   (2006.01)
*H01L 27/11*   (2006.01)
*H01L 21/84*   (2006.01)
*H01L 27/12*   (2006.01)

(52) U.S. Cl.
CPC .......... *H01L 27/1104* (2013.01); *H01L 21/845* (2013.01); *H01L 27/1211* (2013.01)

(58) Field of Classification Search
CPC .............. H01L 21/845; H01L 27/1104; H01L 27/1211
See application file for complete search history.

(56) References Cited

U.S. PATENT DOCUMENTS

| | | | |
|---|---|---|---|
| 6,949,768 B1 | 9/2005 | Anderson et al. | |
| 7,368,354 B2 | 5/2008 | Anderson et al. | |
| 7,544,994 B2 | 6/2009 | Schepis et al. | |

(Continued)

FOREIGN PATENT DOCUMENTS

| CN | 1784742 A | 6/2006 |
|---|---|---|
| CN | 101079434 A | 11/2007 |

(Continued)

OTHER PUBLICATIONS

"Chinese Application Serial No. 201110281517.9, Office Action mailed Nov. 2, 2014", 16 pgs.

(Continued)

*Primary Examiner* — Meiya Li
(74) *Attorney, Agent, or Firm* — Schwegman, Lundberg & Woessner, P.A.

(57) ABSTRACT

In one embodiment, a SRAM cell may include a substrate and a first Fin Field Effect Transistor (FinFET) and a second FinFET formed on the substrate. The first FinFET may include a first fin which is formed in a semiconductor layer provided on the substrate and abuts the semiconductor layer, and the second FinFET may include a second fin which is formed in the semiconductor layer and abuts the semiconductor layer. The semiconductor layer may include a plurality of semiconductor sub-layers. The first and second fins can include different number of the semiconductor sub-layers and have different heights from each other.

9 Claims, 16 Drawing Sheets

(56) References Cited

U.S. PATENT DOCUMENTS

| | | | |
|---|---|---|---|
| 7,781,273 B2 | 8/2010 | Schepis et al. | |
| 7,842,594 B2 | 11/2010 | Cho et al. | |
| 2005/0184316 A1* | 8/2005 | Kim et al. | 257/213 |
| 2008/0122013 A1 | 5/2008 | Schepis et al. | |
| 2008/0251839 A1 | 10/2008 | Lee | |
| 2008/0277743 A1 | 11/2008 | Cho et al. | |
| 2009/0321834 A1* | 12/2009 | Rachmady et al. | 257/365 |
| 2011/0068393 A1 | 3/2011 | Cho | |
| 2011/0121406 A1 | 5/2011 | Lee et al. | |
| 2011/0147711 A1 | 6/2011 | Pillarisetty et al. | |
| 2011/0169101 A1* | 7/2011 | Doornbos et al. | 257/394 |

FOREIGN PATENT DOCUMENTS

| | | | |
|---|---|---|---|
| CN | 101103463 A | | 1/2008 |
| CN | 101286526 A | | 10/2008 |
| CN | 101304042 A | | 11/2008 |
| CN | 101477986 A | | 8/2009 |
| CN | 101877311 A | * | 11/2010 |
| CN | 102074582 A | | 5/2011 |

OTHER PUBLICATIONS

"International Application Serial No. PCT/CN2011/082700, International Preliminary Report on Patentability dated Mar. 25, 2014", (w/ English Translation), 18 pgs.

"International Application Serial No. PCT/CN2011/082700, International Search Report mailed Jun. 28, 2012", (w/ English Translation), 6 pgs.

"International Application Serial No. PCT/CN2011/082700, Written Opinion mailed Jun. 28, 2012", (w/ English Translation), 16 pgs.

* cited by examiner (A)

(B)

(C)

(A)

(B)

(C)

SRAM CELL AND METHOD FOR MANUFACTURING THE SAME

CROSS REFERENCE TO RELEVANT APPLICATION(S)

This application is a National Phase application of, and claims priority to, PCT Application No. PCT/CN2011/082700, filed on Nov. 23, 2011, entitled "SRAM CELL AND METHOD FOR MANUFACTURING THE SAME", which claimed priority to the Chinese Application No. 201110281517.9, entitled "SRAM CELL AND METHOD FOR MANUFACTURING THE SAME", filed on Sep. 21, 2011, both the PCT Application and Chinese Application are incorporated herein by reference in their entireties.

TECHNICAL FIELD

The present disclosure relates to the semiconductor field, and more particularly, to a Static Random Access Memory (SRAM) cell and a method for manufacturing the same, wherein the SRAM cell comprises Fin Field Effect Transistors (FinFETs) which comprise respective fins of different heights.

BACKGROUND

Fin Field Effect Transistors (FinFETs) are increasingly used in a variety of applications due to their faster switching speed, higher current density and better control of short channel effects over conventional transistors. In a typical FinFET, the channel is provided within a semiconductor fin. The fin generally comprises a single-crystalline semiconductor material with a substantially rectangular cross-section. The fin usually has a height greater than its width, so as to achieve a relatively higher on-current per unit area.

While providing improved performances over conventional Metal Oxide Semiconductor Field Effect Transistors (MOSFETs), FinFETs, however, introduce some design challenges. Specifically, the conventional MOSFETs have almost no limit on the device width, while the FinFETs generally comprise respective fins of substantially same height. In other words, for control of the on-current and the off-current of transistors, the conventional MOSFETs provide two parameters, the width W and the length L of the channel, but the FinFETs provide only one parameter, the length L of the channel, because the height of the fin and thus the width of the cannel is fixed for all the FinFETs. Therefore, for a given transistor length L, which defines a ratio of the on-current to the off-current, the amount of the on-current from an individual fin is fixed.

However, transistors with different on-currents are often required in high performance Integrated Circuits. One such example is a 6-transistor Static Random Access Memory (SRAM) cell, wherein a ratio of the on-current of a pull-down transistor to the on-current of a pass gate transistor (that is, the β ratio) needs to be kept close to 2 for optimal performances of the SRAM cell.

FIG. 1 is a top view showing a conventional 6-transistor SRAM cell by way of example. As shown in FIG. 1, on a substrate, active regions 103, gate electrodes 104 and a first level of metal wiring 105 are provided. The SRAM cell includes 6 transistors: a first pull-up P-type Field Effect Transistor (PFET) 110, a first pull-down N-type Field Effect Transistor (NFET) 120, a first pass gate NFET 130, a second pull-up PFET 111, a second pull-down NFET 121, and a second pass gate NFET 131. Here, the first pull-down NFET 120 and the corresponding first pass gate NFET 130 have respective active regions of different widths, to keep the β ratio around 2. Further, the ratio of the widths for the pull-down NFETs 120 and 121 to the pull-up PFETs 110 and 111 is also around 2, so as to give a current ratio (the γ ratio) of the pull-down NFETs 120 and 121 to the pull-up PFETs 110 and 111 around 4.

Typically, FinFETs comprise respective fins of substantially same height. This is because the physical heights of the fins in different FinFETs need to be maintained the same to facilitate lithographic patterning of the fins. Furthermore, unlike conventional MOSFETs, an increase in the physical widths of the fins does not result in a corresponding increase in the channel width (or an increased current), because the channel is on the sidewalls of the respective fins. Therefore, to make a 6-transistor SRAM cell by means of FinFETs, some measures must be taken to maintain the β ratio of about 2 and/or the γ ratio of about 4.

A first solution is to use two fins for one pull-down NFET and only one fin for one pass gate NFET. This results in an increased layout area for the SRAM cell. A second solution is to weaken the pass gate NFETs by making the channel length longer. Specifically, the channel length can be made longer by making gate electrodes for the pass gate NFETs wider, for example. As a result, the on-current is reduced. Also, this measure results in an increased layout area for the SRAM cell. A third solution is to weaken the pass gate NFETs by reducing the height of the fins. This will not increase the layout area for the SRAM cell, because only the vertical dimension is changed. However, presently there is no efficient way to change the fin height.

Therefore, there is a need for a SRAM cell and a method for manufacturing the same, wherein FinFETs constituting the SRAM cell can comprise respective fins of different heights.

SUMMARY

The present disclosure provides, among other things, a SRAM cell and a method for manufacturing the same, by which it is possible to provide fins of different heights in a easy and feasible way.

According to an embodiment, there is provided a SARM cell comprising a substrate and a first FinFET and a second FinFET formed on the substrate. The first FinFET may comprise a first fin which is formed in a semiconductor layer provided on the substrate and abuts the semiconductor layer, and the second FinFET may comprise a second fin which is formed in the semiconductor layer and abuts the semiconductor layer. The semiconductor layer may comprise a plurality of semiconductor sub-layers. The first and second fins can comprise different number of the semiconductor sub-layers and thus have different heights from each other.

According to a further embodiment, there is provided a method for manufacturing a SRAM cell comprising a first FinFET and a second FinFET. The method may comprise: providing a semiconductor layer comprising a plurality of semiconductor sub-layers on a substrate; patterning the semiconductor layer to form a first fin and a second fin abutting the semiconductor layer, wherein the first and second fins are formed by patterning different number of the semiconductor sub-layers and have different heights from each other; and forming the first and second FinFETs based on the first and second fins, respectively.

According to some embodiments, the semiconductor layer in which the fins are formed comprises a plurality of semiconductor sub-layers. The semiconductor sub-layers adjacent to each other can have etching selectivity with respect to each other. Thus, it is possible to pattern the semiconductor sub-layers on a sub-layer by sub-layer basis to form the fins. As a result, the formed fins can have well controlled heights. Further, the fins can be formed by different number of the sub-layers and thus can have different heights from each other.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
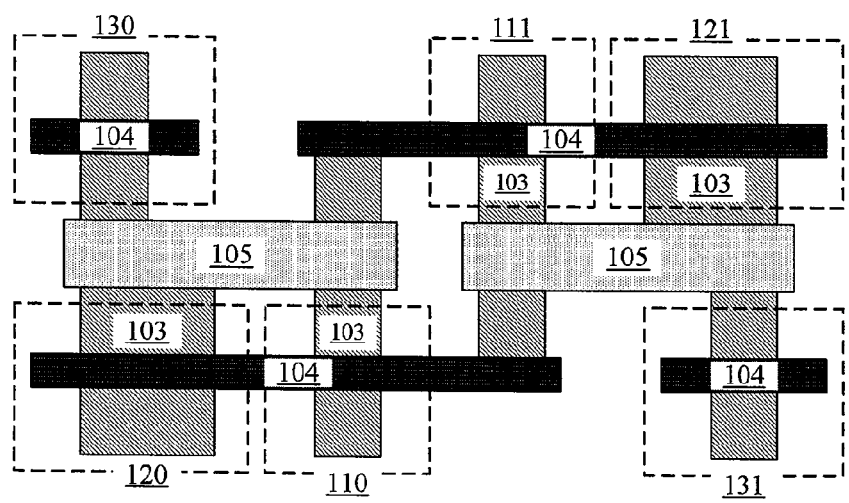
FIG. 1 is a top view showing a conventional 6-transistor SRAM cell.

Hereinafter, descriptions are given with reference to embodiments shown in the attached drawings. However, it is to be understood that these descriptions are only illustrative, and are not intended to limit the present disclosure. Further, in the following, known structures and technologies are not described to avoid obscuring the present disclosure unnecessarily.

In the drawings, various layer structures according to the embodiments are shown. However, they are not drawn to scale, and some features may be enlarged while some features may be omitted for the sake of clarity. Moreover, shapes, sizes, and relative positions of regions and layers shown in the drawings are also illustrative only, and deviations may occur due to manufacture tolerances and technique limitations in practice. Those skilled in the art can also devise regions/layers of other different shapes, sizes, and relative positions as desired.

The following descriptions are given with respect to Si based materials, by way of example. However, it is to be understood that the present disclosure is not limited to the Si based materials, and is also applicable to other semiconductor materials.

Figure 2:
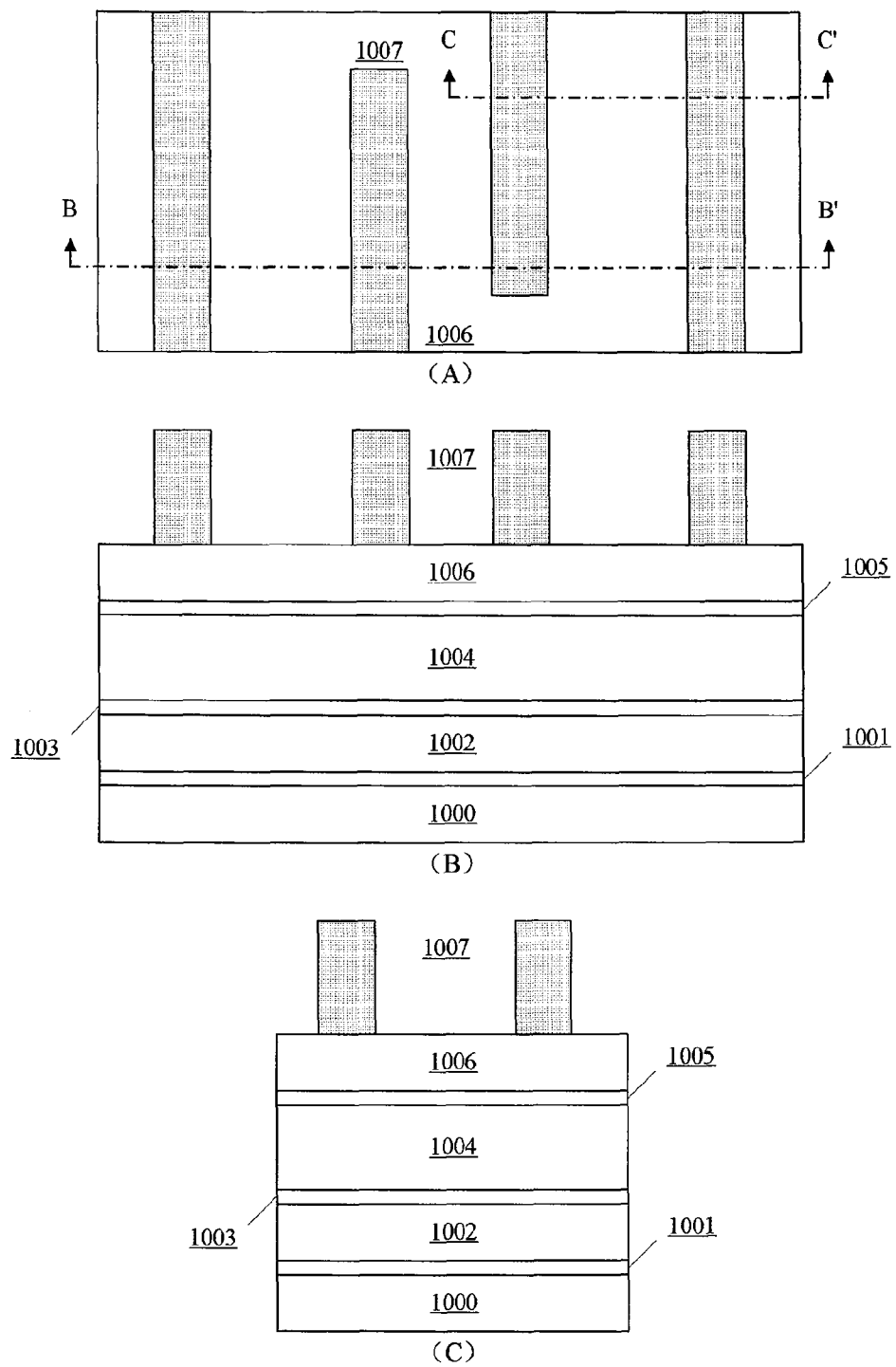
FIGS. 2-16 are schematic views showing structures obtained in different steps in a flow of manufacturing a semiconductor structure according to an embodiment of the present disclosure, wherein (A) is a top view, (B) is a cross-section view taken along line B-B', and (C) is a cross-section view taken along line C-C'.

As shown in FIG. 2, a substrate 1000, for example, a bulk semiconductor substrate such as a bulk Si substrate, is provided. On the substrate 1000, a semiconductor layer, including a first semiconductor sub-layer 1001, a second semiconductor sub-layer 1002, a third semiconductor sub-layer 1003, and a fourth semiconductor sub-layer 1004 which are stacked sequentially, is provided. For example, the first semiconductor sub-layer 1001 may comprise SiGe (where the atomic percentage of Ge is about 5-20%) with a thickness of about 2-15 nm, the second semiconductor sub-layer 1002 may comprise Si with a thickness of about 20-150 nm, the third semiconductor sub-layer 1003 may comprise SiGe (where the atomic percentage of Ge is about 5-20%) with a thickness of about 1-10 nm, and the fourth semiconductor sub-layer 1004 may comprise Si with a thickness of about 20-150 nm. These semiconductor sub-layers are sequentially formed on the substrate 1000 by means of, for example, expitaxy.

On the semiconductor layer, a hard mask layer, which, for example, includes an oxide layer (e.g., silicon oxide) 1005 and a nitride layer (e.g., silicon nitride) 1006, is formed. The oxide layer 1005 and the nitride layer 1006 may be formed on the substrate by means of, for example, deposition. For example, the oxide layer 1005 may have a thickness of about 2-5 nm, and the nitride layer 1006 may have a thickness of about 10-50 nm.

A photo resist layer 1007 is coated on the above structure, and then is patterned to correspond to a fin pattern to be formed. Specifically, in an example of 6-transistor SRAM cell, the photo resist layer 1007 can be patterned into 4 bars. As shown in FIG. 2, from left to right, the 4 bars can be: one corresponding to respective fins of a first pull-down NFET (referring to 120 shown in FIG. 1) and a first pass gate NFET (referring to 130 shown in FIG. 1) (the two fins being connected together in practice, as will be described in the following), one corresponding to a fin of a first pull-up PFET (referring to 110 shown in FIG. 1), one corresponding to a fin of a second pull-up PFET (referring to 111 shown in FIG. 1), and one corresponding to respective fins of a second pull-down NFET (referring to 121 shown in FIG. 1) and a second pass gate NFET (referring to 131 shown in FIG. 1) (the two fins being connected together in practice, as will be described in the following), respectively.

Figure 3:
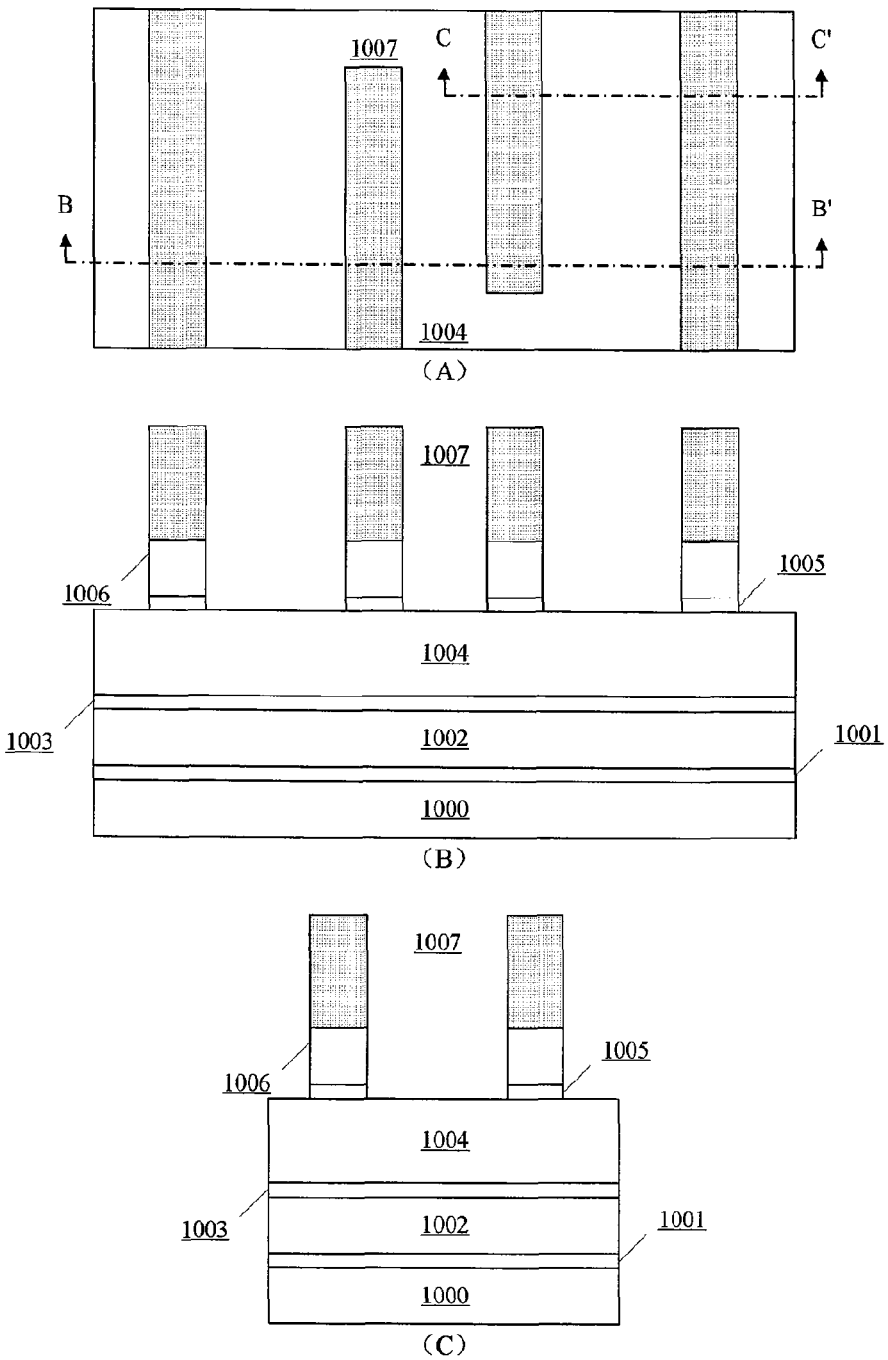

Then, as shown in FIG. 3, the hard mask layer (including the oxide layer 1005 and the nitride layer 1006) is patterned using the patterned photo resist layer 1007 as a mask. The patterning may be conducted by means of Reactive Ion Etching (RIE), for example. After that, the photo resist layer 1007 can be removed.

After the hard mask layer is patterned, the semiconductor layer (including the semiconductor sub-layers) may be patterned using the patterned hard mask layer (including the oxide layer 1005 and the nitride layer 1006) as a mask to form the respective fins. According to an embodiment, it is possible to form the fins of the FinFETs by different number of the semiconductor sub-layers, so as to achieve the fins of different heights.

Figure 4:
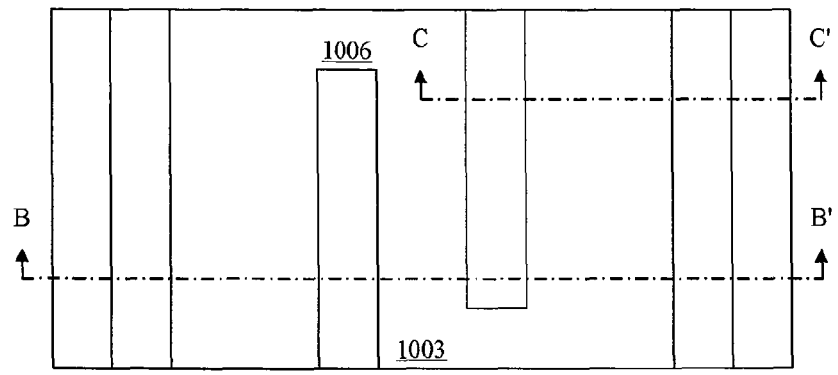
Figure 4:
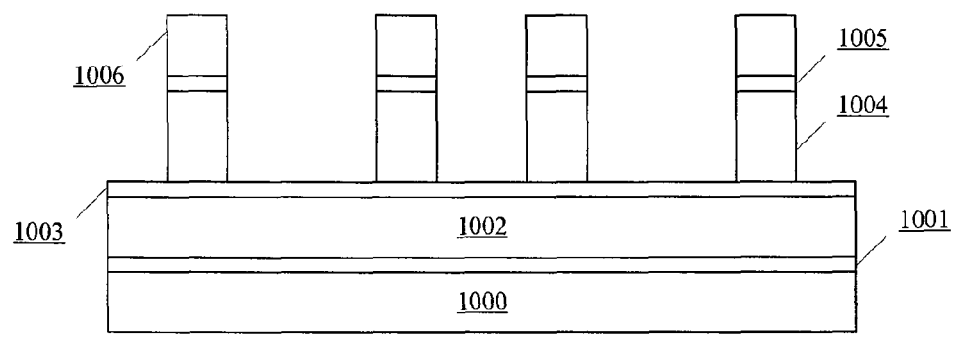
Figure 4:
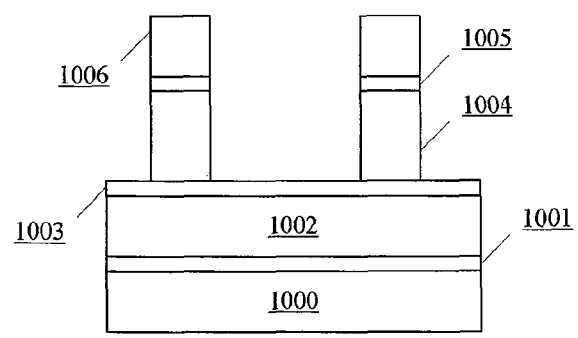

Specifically, as shown in FIG. 4, firstly the Si sub-layer 1004 is etched selectively with respect to the SiGe sub-layer 1003, resulting in the patterned Si sub-layer 1004 (including 4 bars as shown in FIG. 4). The patterned Si sub-layer 1004 constitutes fins of a first height. Specifically, the upper portion of the leftmost bar shown in FIG. 4(A) corresponds to the fin of the first pass gate NFET (referring to 130 shown in FIG. 1), the second bar from left shown in FIG. 4(A) corresponds to the fin of the first pull-up PFET (referring to 110 shown in FIG. 1), the second bar from right shown in FIG. 4(A) corresponds to the fin of the second pull-up PFET (referring to 111 shown in FIG. 1), and the lower portion of the rightmost bar shown in FIG. 4(A) corresponds to the fin of the second pass gate NFET (referring to 131 shown in FIG. 1). The height of those fins (i.e., the first height) correspond to the thickness of the semiconductor sub-layer 1004.

Figure 5:
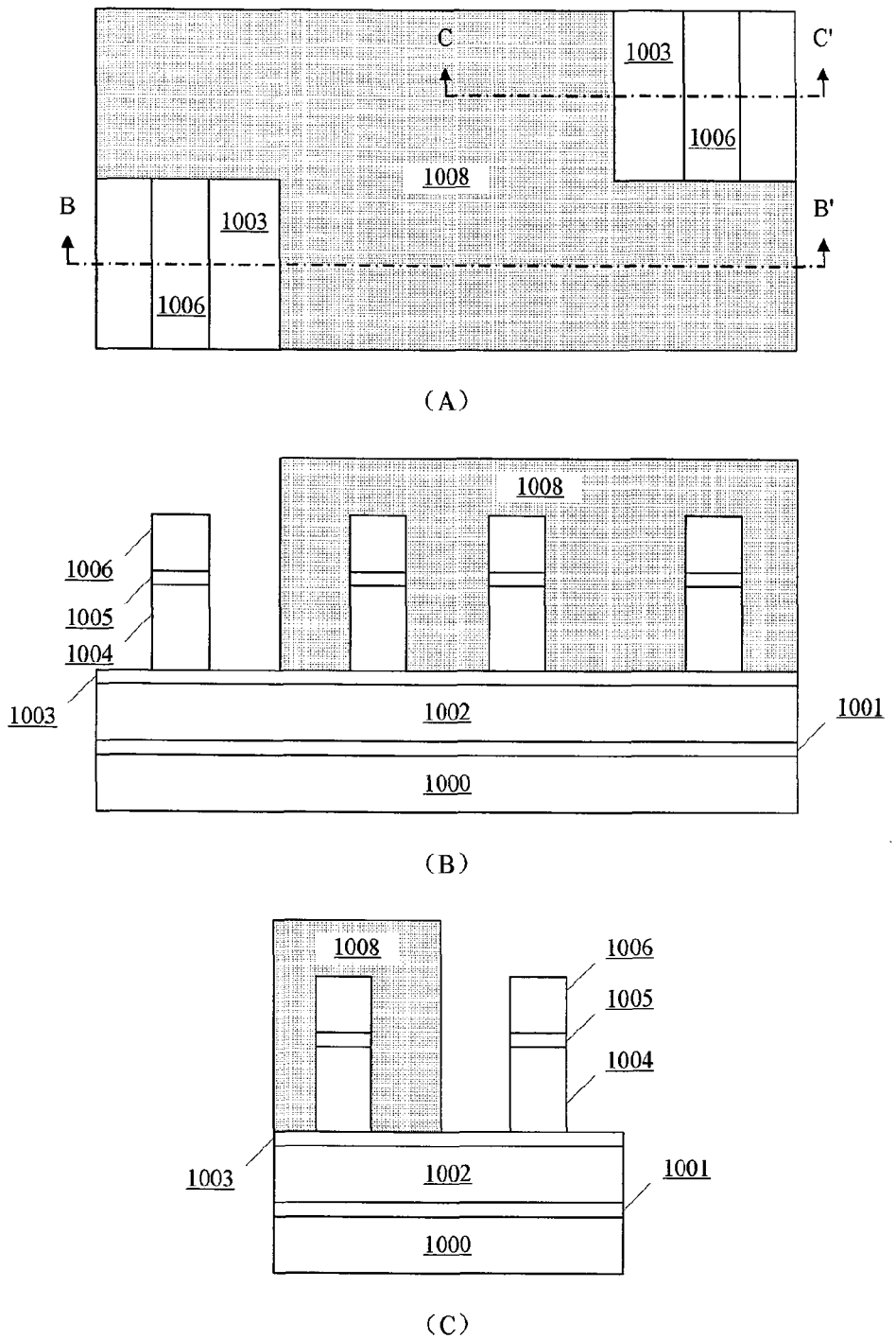

Next, as shown in FIG. 5, a mask layer such as a photo resist layer 1008 is formed to cover the structure shown in FIG. 4, and then is patterned to expose only regions corresponding to the pull-down transistors (referring to 120 and 121 shown in FIG. 1).

Figure 6:
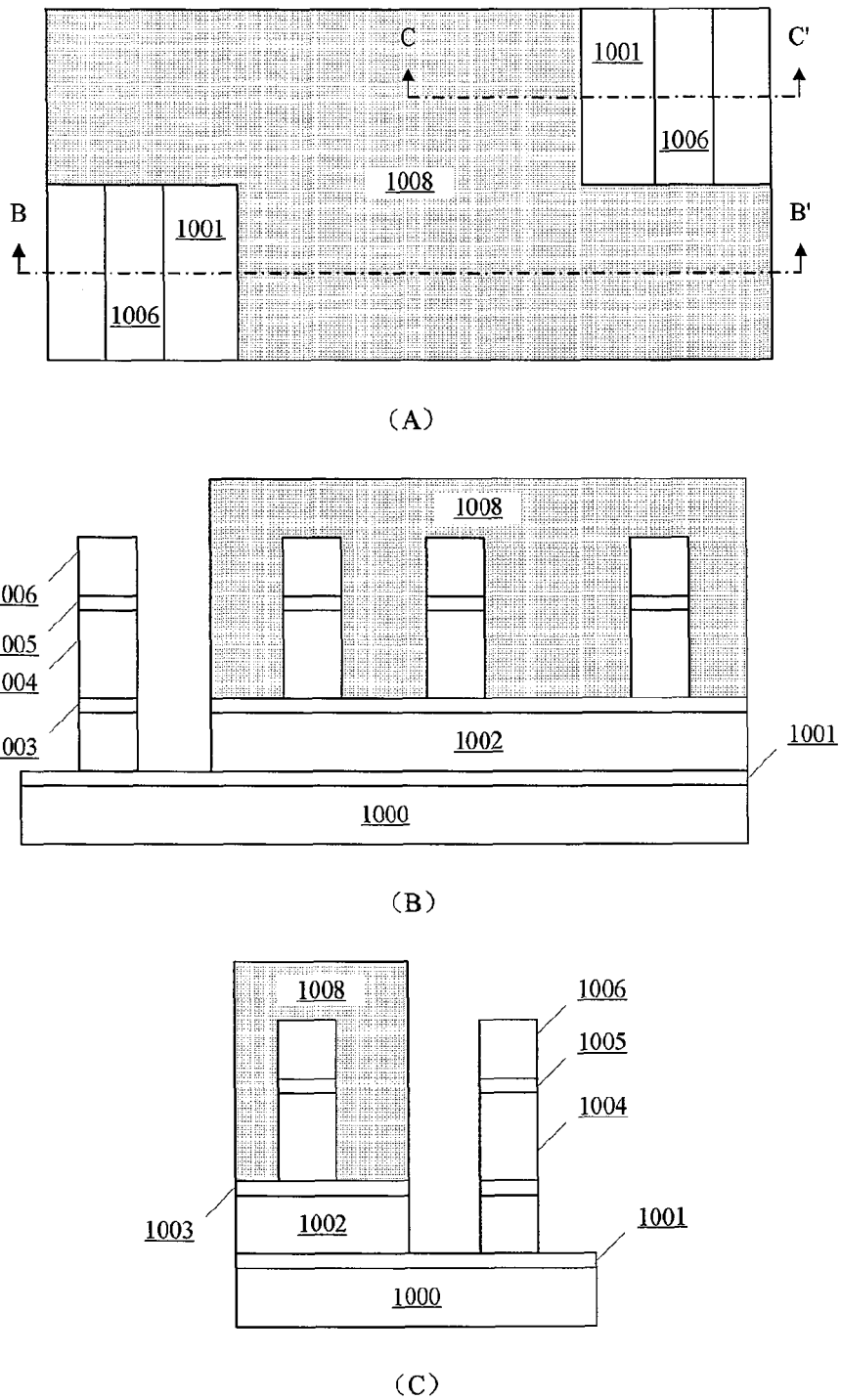

Subsequently, as shown in FIG. 6, the semiconductor layer in the exposed regions is further etched using the patterned mask layer 1008 as a mask, to increase the height of the fins in those regions. Specifically, in the regions of the pull-down transistors, the SiGe sub-layer 1003 is etched selectively with respect to the Si sub-layer 1002, and then the Si sub-layer 1002 is etched selectively with respect to the SiGe sub-layer 1001. After that, the mask layer 1008 can be removed.

Thus, fins having a second height are formed. Specifically, the lower portion of the leftmost bar shown in FIG. 6(A) corresponds to the fin of the first pull-down NFET (referring to 120 shown in FIG. 1), and the upper portion of the rightmost bar shown in FIG. 6(A) corresponds to the fin of the second pull-down NFET (referring to 121 shown in FIG. 1). These two fins consist of the patterned semiconductor sub-layers 1002, 1003, and 1004, and thus have a height (that is, the second height) corresponding to a sum of the thickness of the semiconductor sub-layers 1002, 1003, and 1004.

Thus, an arrangement where fins have different heights is formed. Specifically, as shown in FIG. 6, in the example of 6-transistor SRAM cell, in the regions corresponding to the pull-up transistors and the pass gate transistors, the fins of the first height (comprising the semiconductor sub-layer 1004) are formed; while in the regions corresponding to the pull-down transistors, the fins of the second height (comprising the semiconductor sub-layers 1002, 1003, and 1004) are formed. That is, the pull-down transistors have respective fins which are greater in height, and thus each have a larger channel width to provide a larger on-current.

According to this embodiment, the semiconductor sub-layers adjacent to each other (for example, the Si sub-layer and the SiGe layer) have materials different from each other, and can have etching selectivity with respect to each other. As a result, it is possible to etch the semiconductor sub-layers on a sub-layer by sub-layer basis in patterning the fins, and thus it is possible to control the heights of the finally obtained fins in a substantially precise manner. Further, in this embodiment, the Si sub-layers serving as fin main-body sub-layers are relatively thicker, while the SiGe sub-layers which are relatively thinner serve as etching stop layers for the respective Si sub-layers.

Furthermore, according to this embodiment, it is possible to form fins of different heights by different number of semiconductor sub-layers. The specific numbers of the semiconductor sub-layers included in the respective fins are not particularly limited. For example, the fins can be made of even more sub-layers.

Here, it is to be noted that in the context of the present disclosure a "height" of a fin refers to an extent from a top surface of the fin to a bottom surface of the fin (that is, a surface of the semiconductor layer which the fin abuts). For example, in the example shown in FIG. 6, in the regions of the pull-up transistors and the pass gate transistors, the height of the fins is the extent from the top surface of the semiconductor sub-layer 1004 (i.e., the top surface of the fins in these regions) to the top surface of the semiconductor sub-layer 1003 (i.e., a surface of the semiconductor layer in portions of these regions other than the fins); and in the regions of the pull-down transistors, the height of the fins is the extent from the top surface of the semiconductor sub-layer 1004 (i.e., the top surface of the fins in these regions) to the top surface of the semiconductor sub-layer 1001 (i.e., a surface of the semiconductor layer in portions of these regions other than the fins).

Here, the term "abut" or "abutting" refers to the fact that the fin directly contacts the semiconductor layer, without any intervening layers. There may also be such a situation where the semiconductor layer has an underlying layer such as the substrate. In this situation, a fin can extend through the whole semiconductor layer (that is, the fin having such a thickness is formed from the semiconductor layer in its entire thickness). Then, the bottom surface of the fin is at the same level as the bottom surface of the semiconductor layer. In the context of the present disclosure, this situation is also considered as that the fin "abuts" the semiconductor layer because there is no intervening layer between the fin and the semiconductor layer.

According to this embodiment, the respective top surfaces of the fins are substantially flush with each other for convenience of subsequent processes, but can have different heights due to the different levels of the respective surfaces of the semiconductor layer in the respective regions where the respective fins are positioned.

After the fins of different heights are formed as described above, subsequent processes can be conducted to form final devices.

According to a further embodiment, a block region may be formed at the bottom of each of the fins, so as to at least partially suppress current leakage between source and drain regions of the respective final FinFETs through the bottom of the respective fins. Preferably, for an NFET, the block region may be p-type doped; while for a PFET, the block region may be n-type doped.

Figure 7:
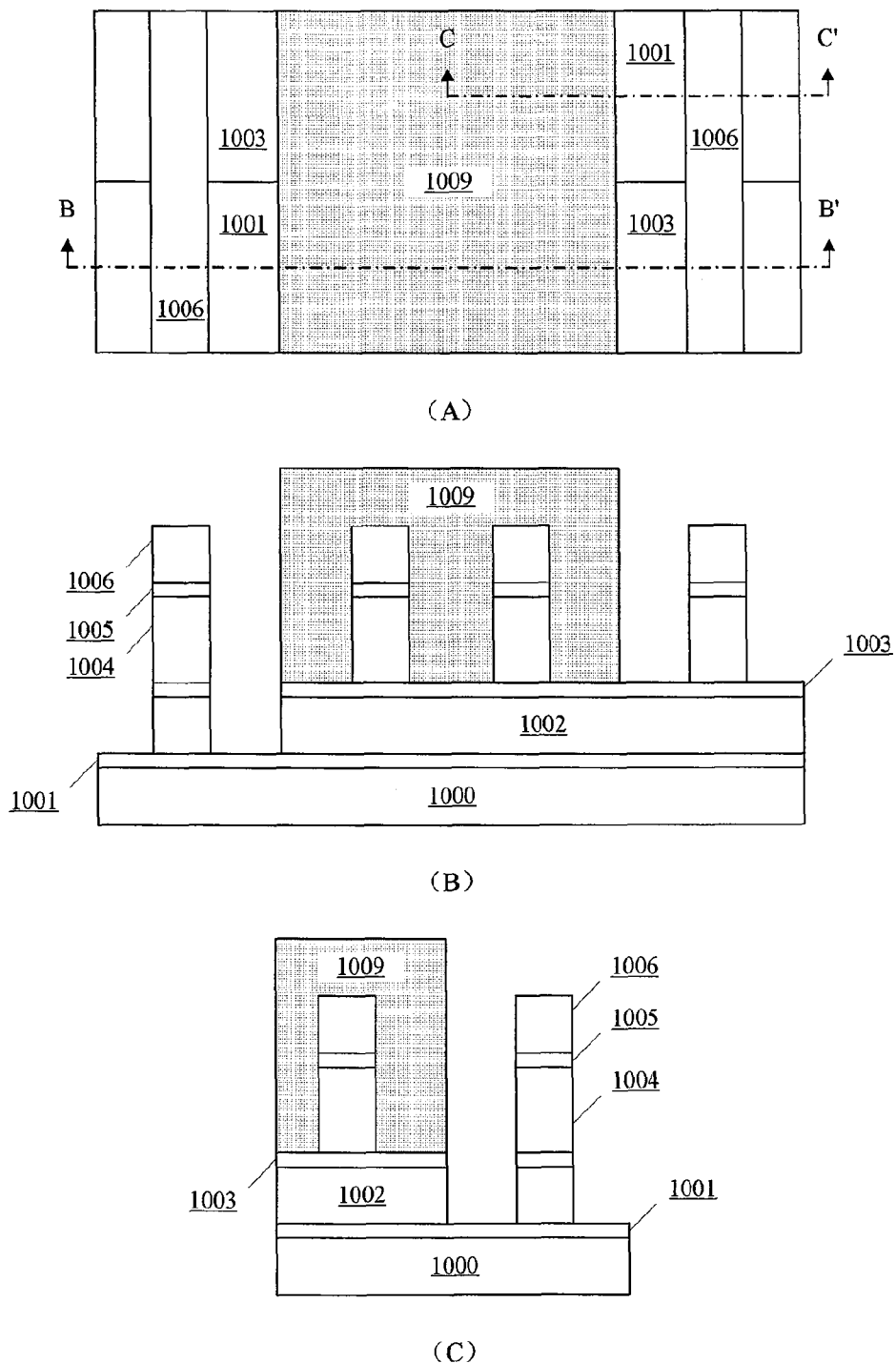

Specifically, as shown in FIG. 7, a mask layer such as a photo resist layer 1009 is formed, and then is patterned to cover the PFET regions. Next, as indicated by arrows in FIG. 8, ion implantation is conducted on the NFET regions to implant dopants for formation of the block region into the semiconductor layer. Here, the dopants are preferably p-type dopants such as B or BF2. Then, the mask layer 1009 can be removed. Due to the presence of the hard mask layer, especially, the nitride layer 1006, the implantation is self-aligned to both sides of the respective fins.

Figure 9:
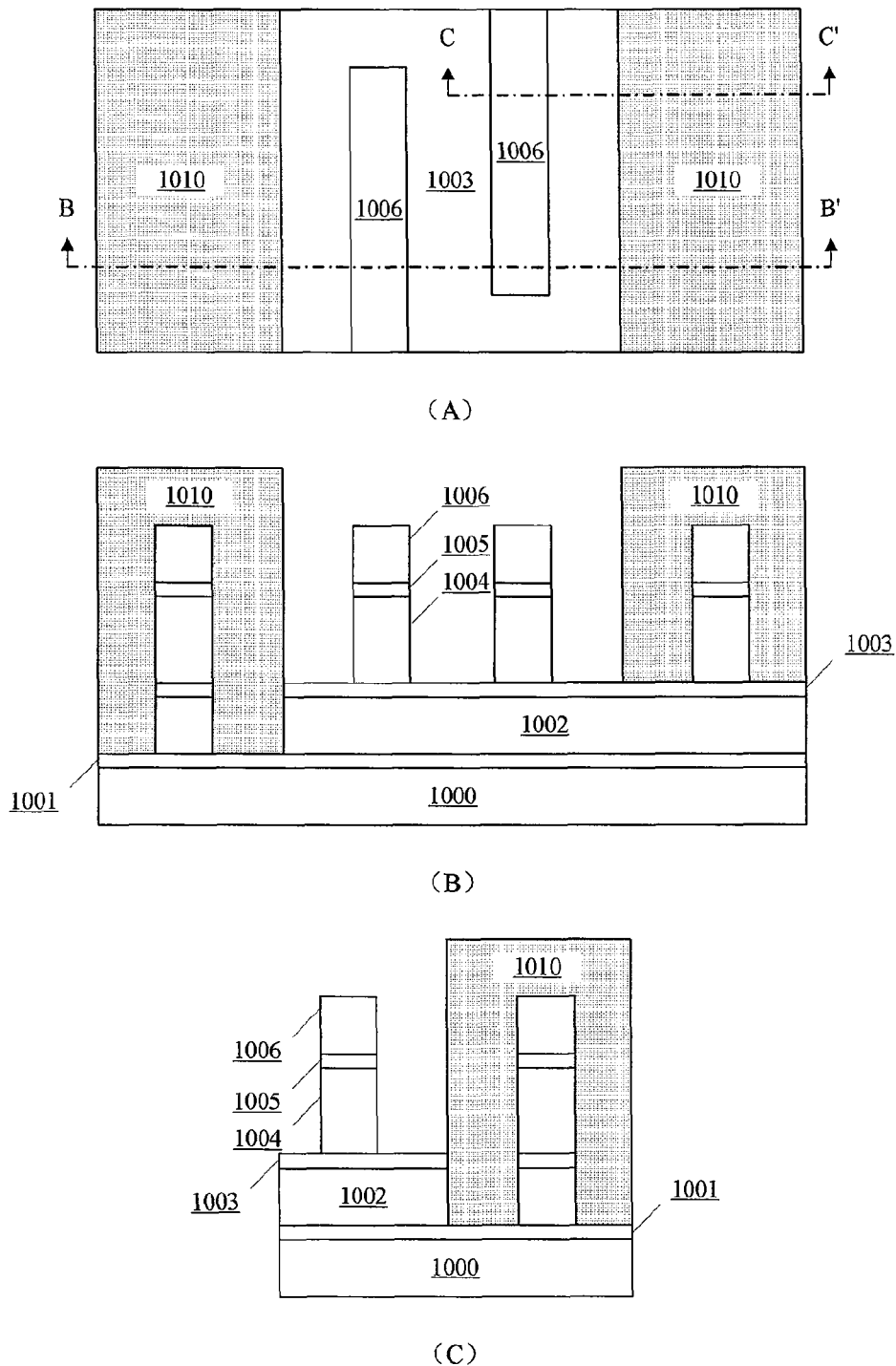

Likewise, as shown in FIG. 9, a mask layer such as a photo resist layer 1010 is formed, and then is pattered to cover the NFET regions. Next, as indicated by arrows in FIG. 10, ion implantation is conducted on the PFET regions to implant dopants for formation of the block region into the semiconductor layer. Here, the dopants are preferably n-type dopants such as P or As. Then, the mask layer 1010 can be removed. Due to the presence of the hard mask layer, especially, the nitride layer 1006, the implantation is self-aligned to both sides of the respective fins.

Figure 8:
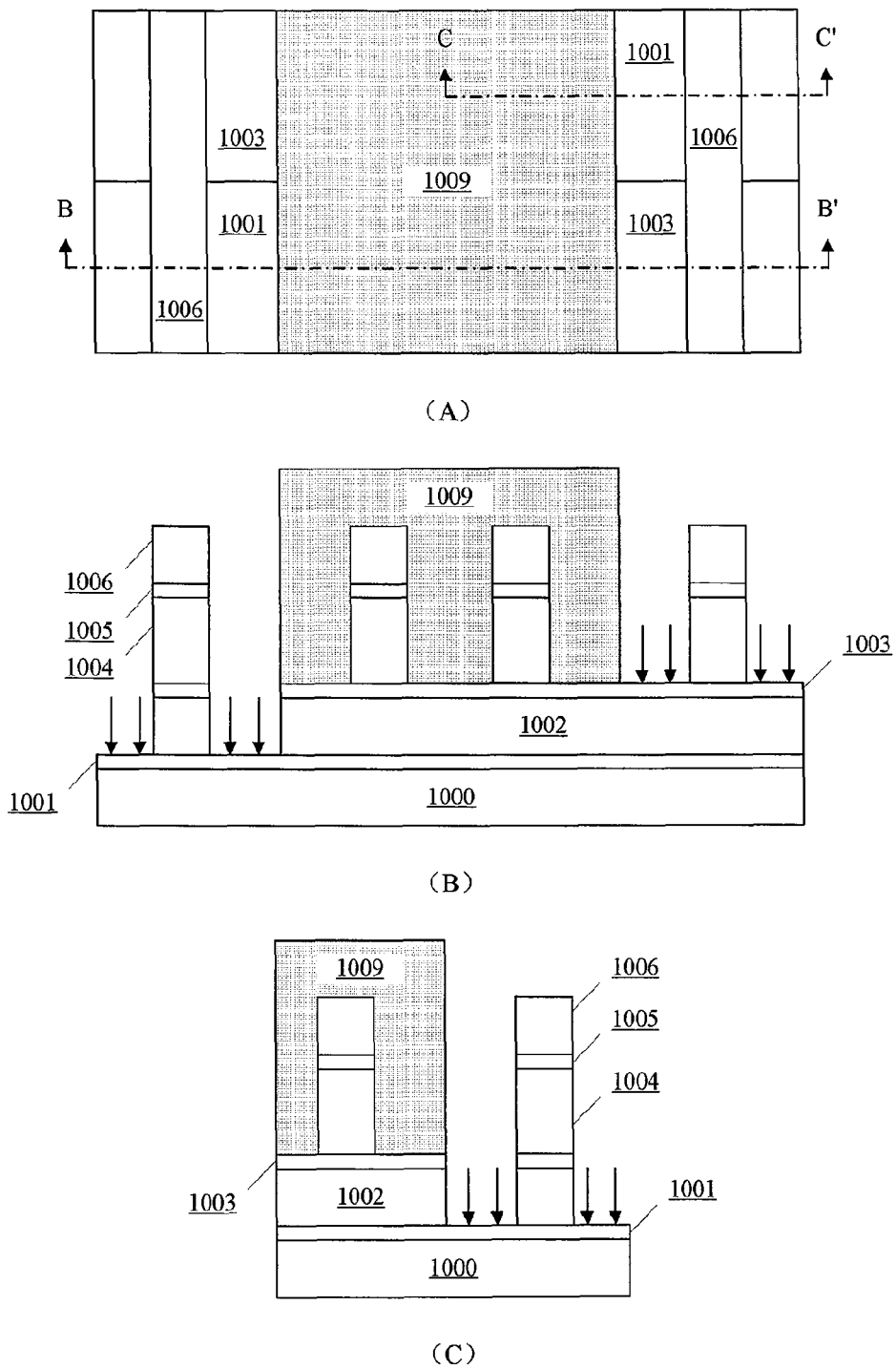
Figure 10:
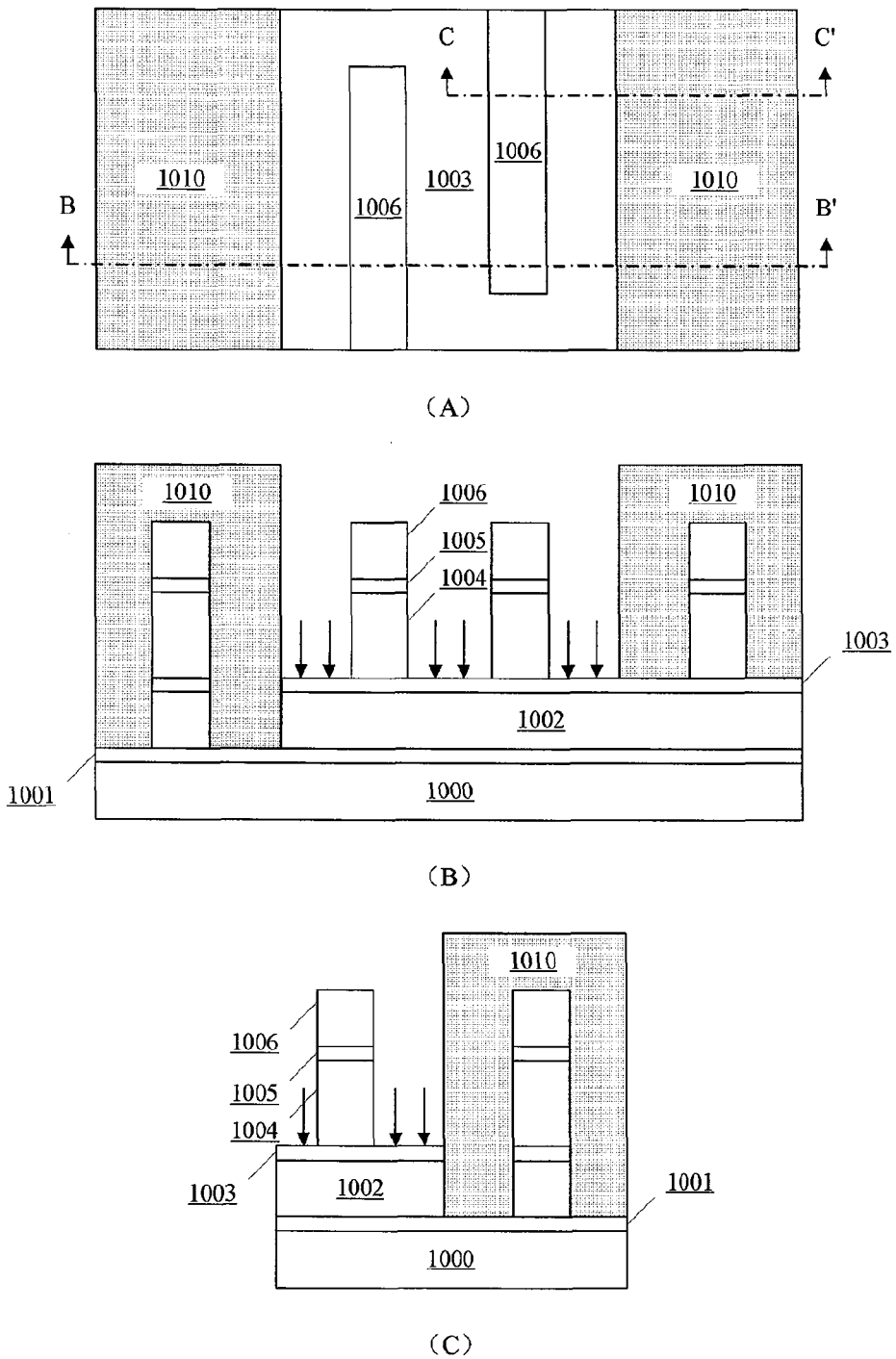

Here, it is to be noted that the process shown in FIGS. 7 and 8 and the process shown in FIGS. 9 and 10 can be exchanged in order.

Figure 11:
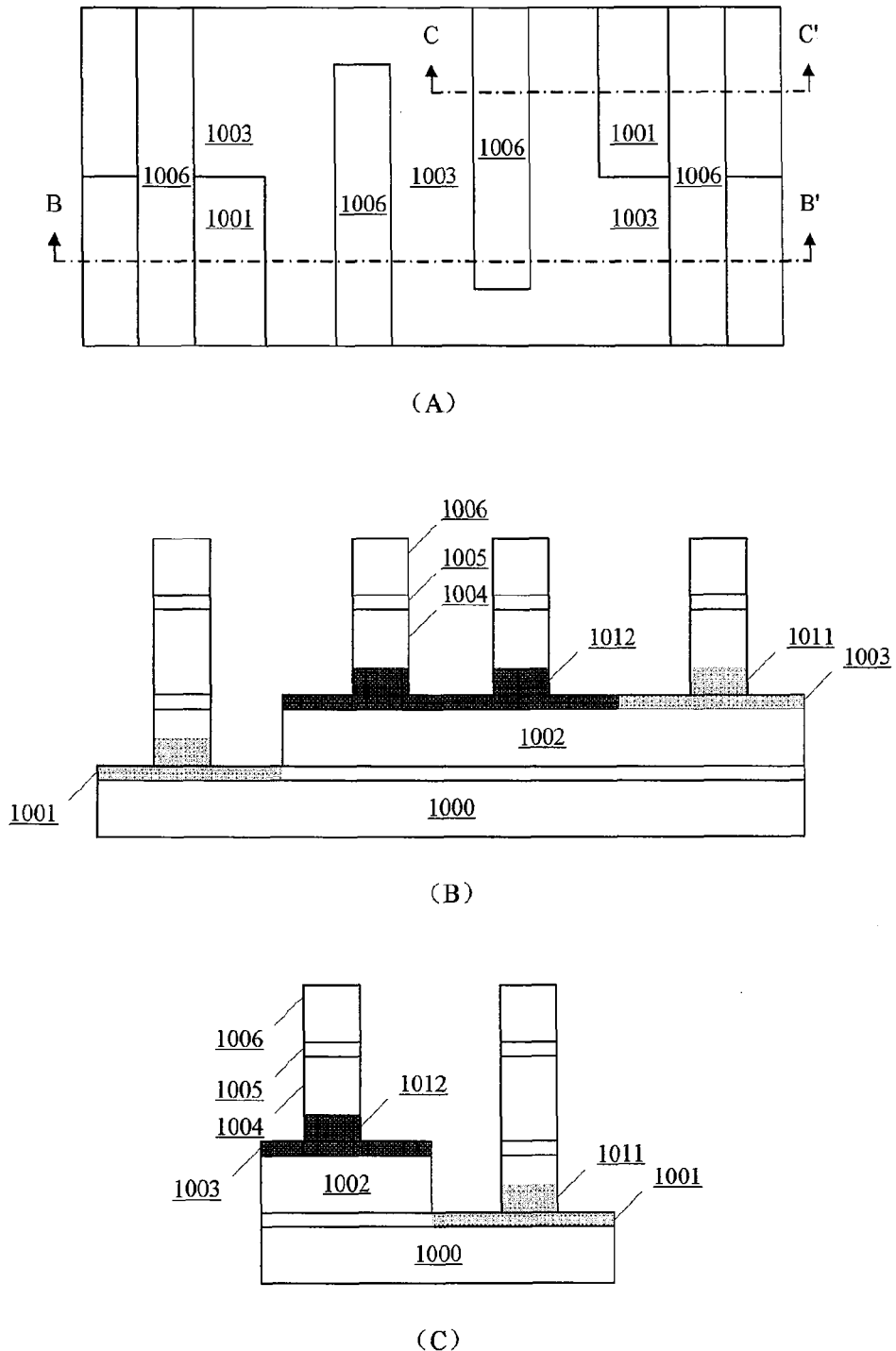

After the implantation for the block regions as described above, the implanted dopants can be activated by annealing, so that the dopants can diffuse into the bottom of the respective fins to form the block regions. The formed block regions may have a doping concentration of about $1 \times 10^{16}$ cm$^{-3}$-$1 \times 10^{19}$ cm$^{-3}$. As shown in FIG. 11, p-type doped block regions 1011 are formed in the NFET regions, while n-type doped block regions 1012 are formed in the PFET regions. It is to be noted that the block regions 1011 and 1012 may have boundaries which are not sharp. In the drawings, the block regions 1011 and 1012 are shown to have straight and definite boundaries for convenience. Further, in the drawings some boundaries of the block regions 1011 and 1012 are shown to overlap with boundaries of the semiconductor sub-layers 1003 and 1001 for convenience. The present disclosure is not limited thereto. Preferably, the top surface of the respective bock regions is higher than that of an isolation layer to be formed, so that gate electrodes can control the fins more effectively.

Next, an isolation layer can be formed on both sides of the respective fins, and gate stacks can be formed on the isolation layer to cross over the respective fins, so as to complete the FinFETs, as in the conventional FinFET process.

Alternatively, according to an embodiment it is possible to form a gate dielectric layer and an optional work function adjustment layer on sidewalls of the respective fins before formation of an isolation layer, unlike the conventional process where the isolation layer is formed on both sides of the respective fins before the gate dielectric layer and the work function adjustment layer are formed on sidewalls of the respective fins over the isolation layer. In the conventional process, a portion of the fin which is covered by the gate dielectric layer has its height, corresponding to the channel width of the final device, determined not only by the height of the fin itself but also by the thickness of the isolation layer. However, according to this embodiment, the gate dielectric layer (and the optional work function adjustment layer) can cover the fin in its whole height, irrespective of the thickness of the isolation layer which is to be formed later. As a result, the channel width of the final device can be well controlled.

Figure 12:
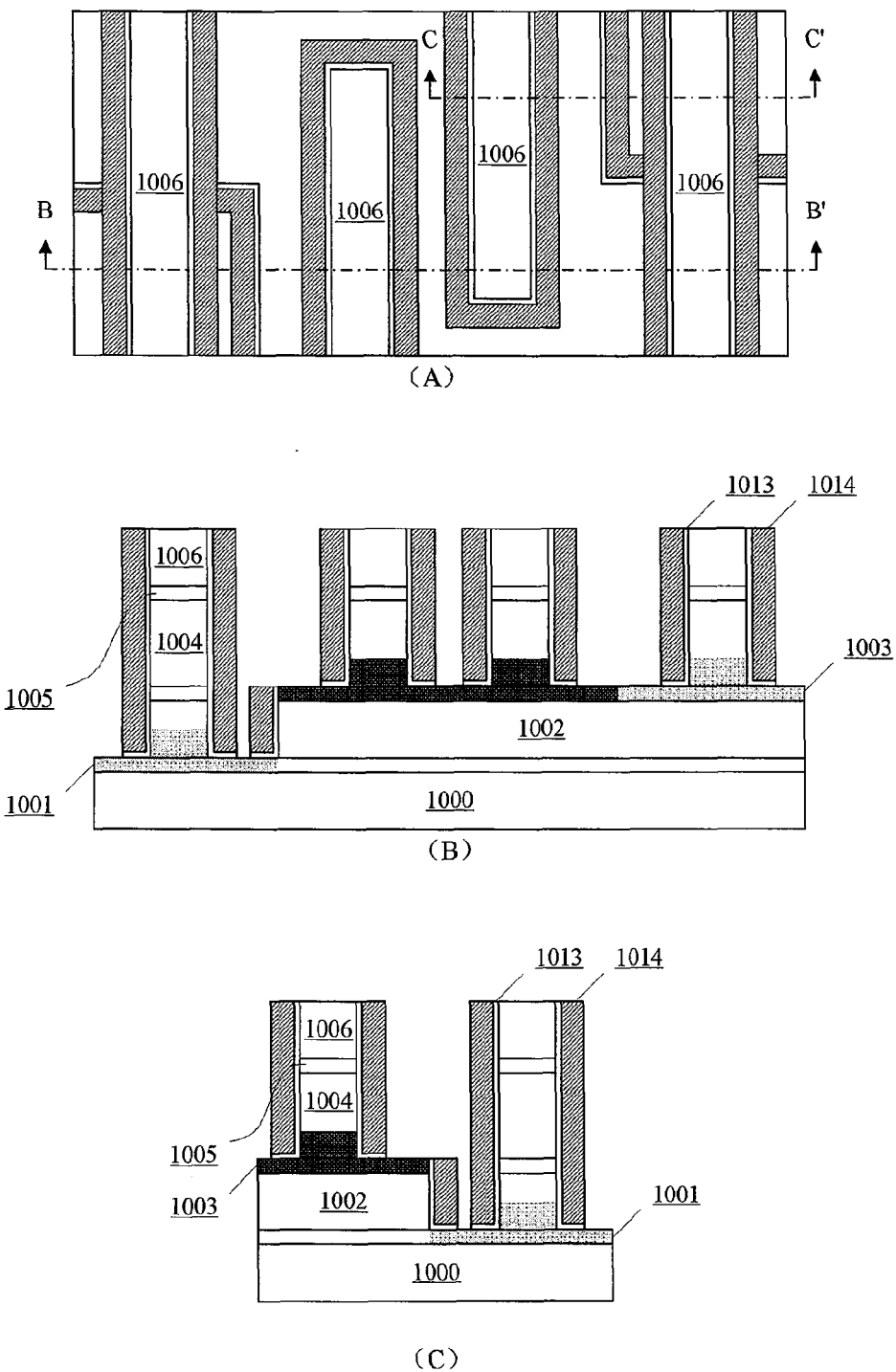

Specifically, as shown in FIG. 12, a gate dielectric layer 1013 and optionally a work function adjustment layer 1014, in form of spacers, are formed on vertical walls of the structure shown in FIG. 11. Preferably, the gate dielectric layer may comprise high K gate dielectric, such as $HfO_2$, HfSiO, HfSiON, HfTaO, HfTiO, HfZrO, $Al_2O_3$, $La_2O_3$, $ZrO_2$, and LaAlO, and the work function adjustment layer may comprise TiN, TiAlN, TaN, TaAlN, TaC, and the like. The formation of the spacers is apparent to those skilled in the art. For example, a high K dielectric layer and a work function adjustment layer can be sequentially deposited on the structure and then be subjected to RIE, to form the high K dielectric layer 1013 and the work function adjustment layer 1014 in form of spacers as shown in FIG. 12.

It is to be noted that in this embodiment the hard mask layers 1005, 1006 are kept on the top of the fins and thus the gate dielectric layer 1003 and the work function adjustment layer 1014 are formed on two sidewalls of the respective fins (resulting in 2-gate devices). However, the present disclosure is not limited thereto, but is also applicable to 3-gate devices. For example, the hard mask layer 1005, 1006 on the top of the fins can be removed, and thus the gate dielectric layer and the work function adjustment layer can be formed on three sidewalls of the respective fins (i.e., the left and right sidewalls and the top sidewall).

Figure 13:
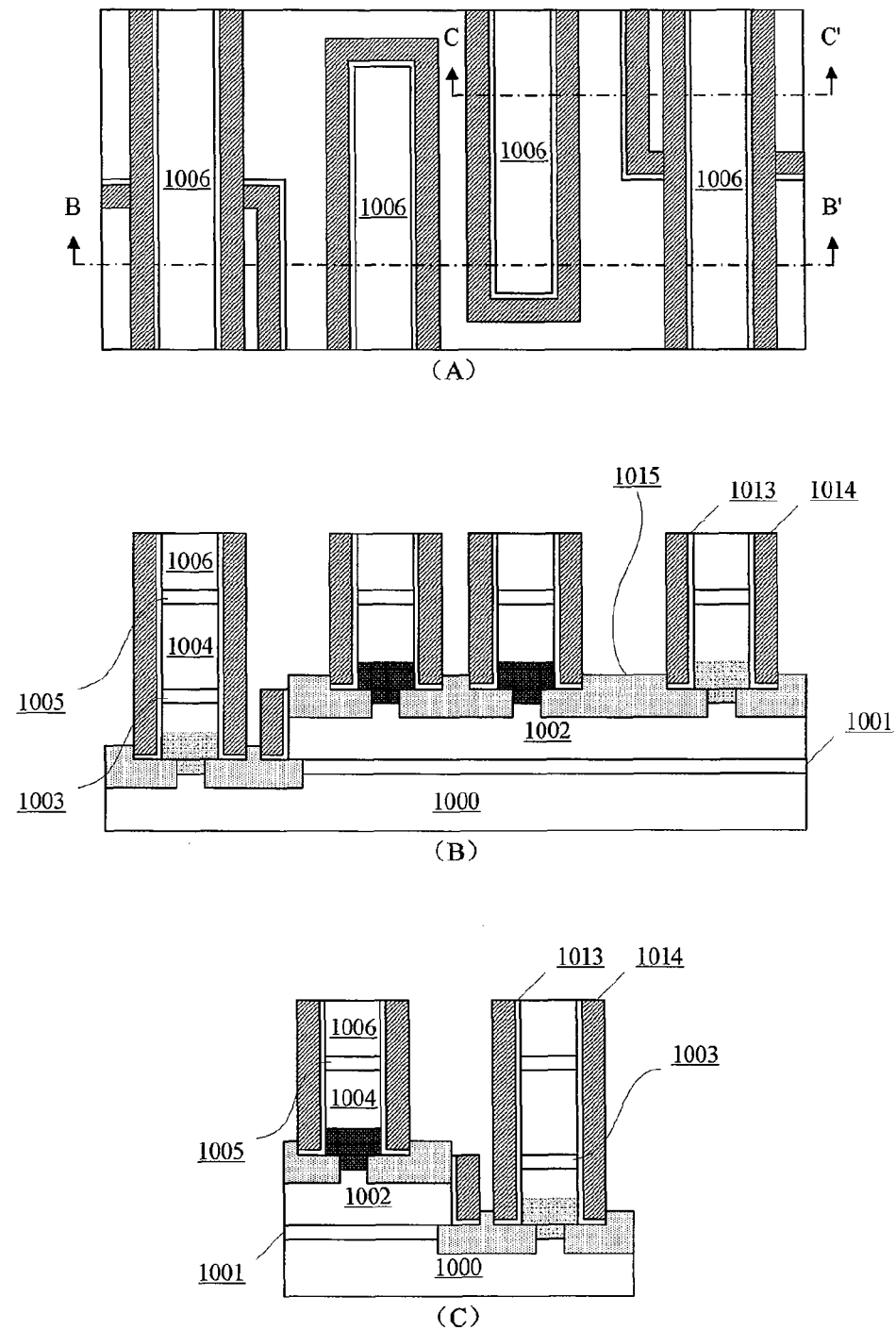

Next, as shown in FIG. 13, the semiconductor layer can be subjected to oxidation, so that a portion of the semiconductor close to its surface is converted into oxide which forms an isolation layer 1015. The oxidation may be conducted by thermal treatment in an atmosphere of oxygen, for example. Portions of the semiconductor layer underlying the fins are covered by the fins and the hard mask layer, and thus are prevented from being oxidized, ensuring reliable connection of the fins to the substrate. In FIG. 13(A), the isolation layer 1015 is not shown for clarity.

It is to be noted that the isolation layer may be formed in different ways. For example, an oxide layer (e.g., $SiO_2$) may be deposited on the whole structure. The oxide layer may have its bottom portion thicker and have portions on sidewalls of the respective fins thinner. Then, the oxide layer can be isotropically etched back to expose the sidewalls of the fins, resulting in the isolation layer.

Figure 14:
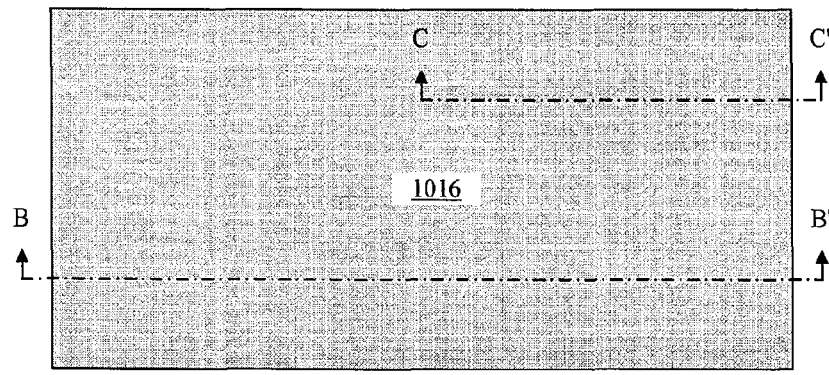
Figure 14:
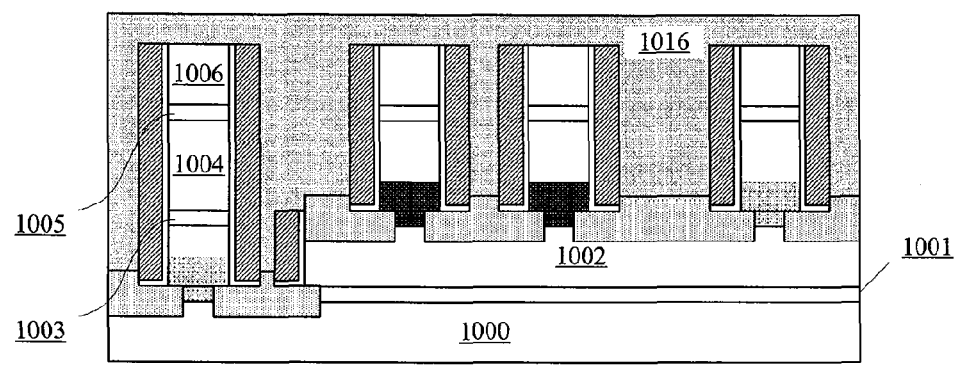
Figure 14:
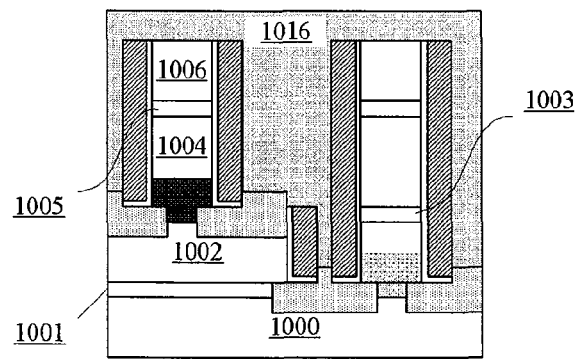
Figure 15:
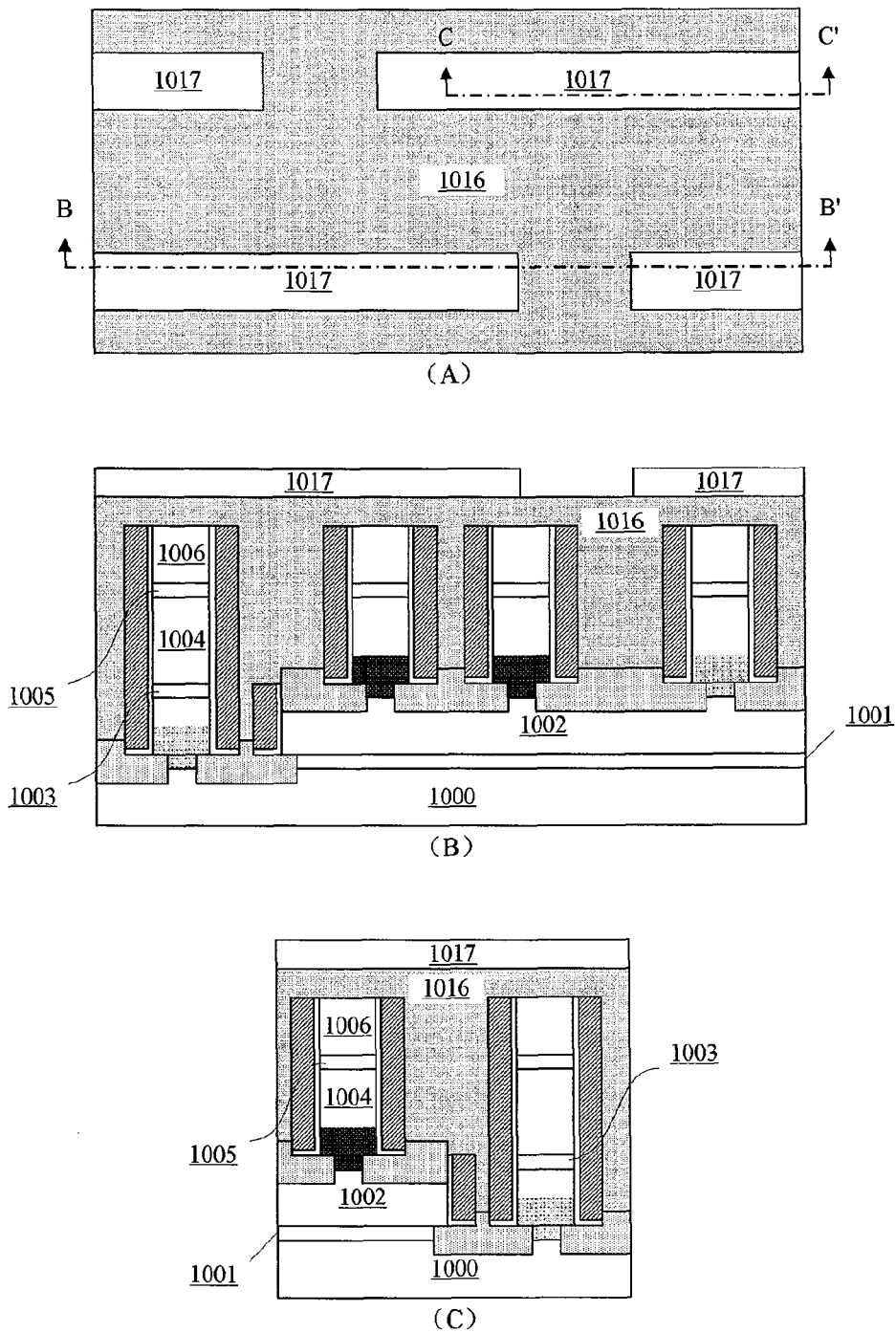
Figure 16:
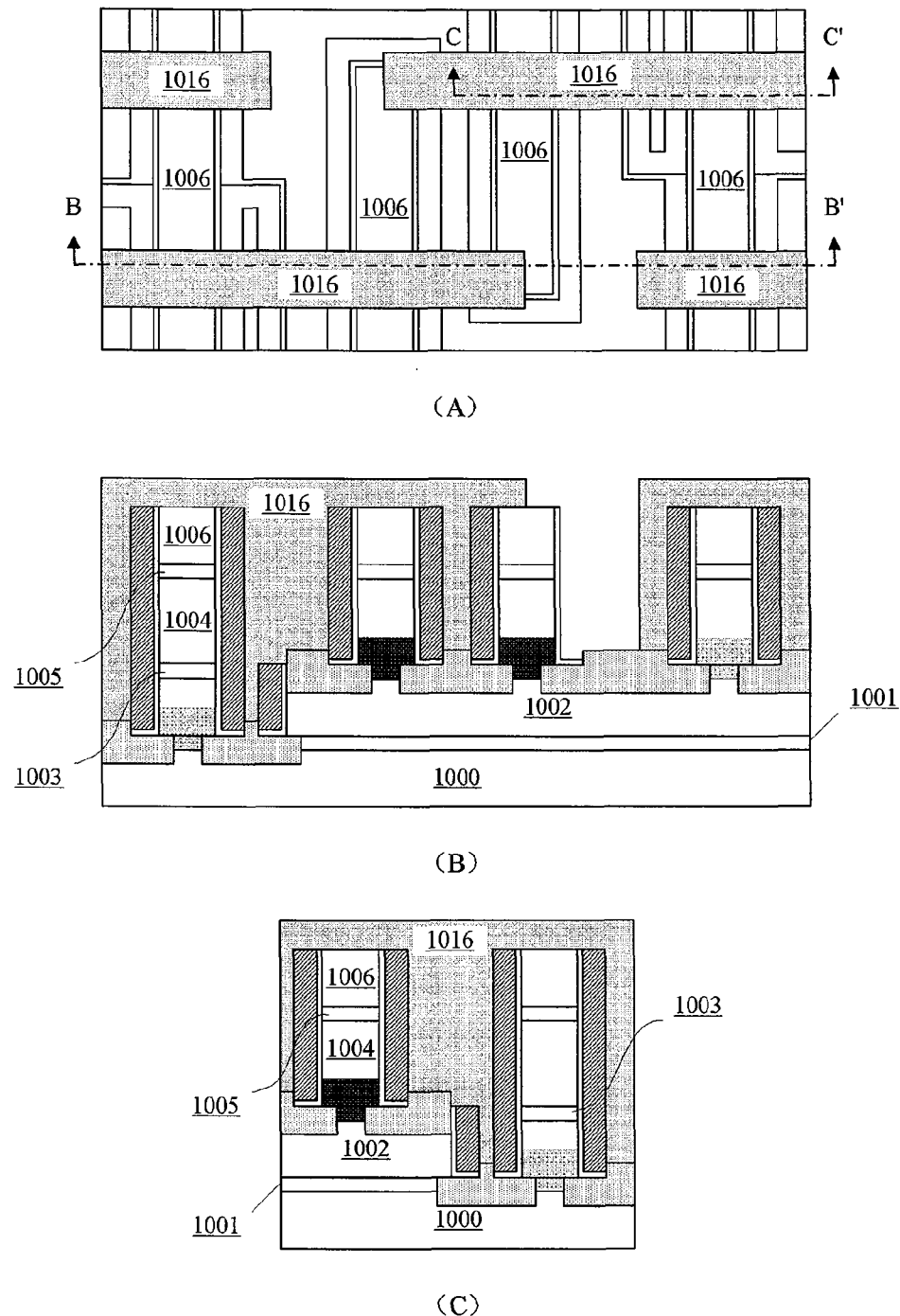

Then, as shown in FIG. 14, a gate electrode layer 1016, such as a poly silicon layer, can be deposited on the structure shown in FIG. 13. Alternatively, the gate electrode layer may comprise metal gate electrode material such as Ti, Co, Ni, Al, and W. Next, as shown in FIG. 15, a photo resist layer 1017 is coated over the poly silicon layer 1016, and then is patterned into a pattern corresponding to gate electrodes to be formed. Specifically, in the example of 6-transistor SRAM cell, the photo resist layer 1017 can be patterned into 4 bars corresponding to the gate electrodes 104 shown in FIG. 1. Next, as shown in FIG. 16, the gate electrode layer 1016 and the work function adjustment layer 1014 are patterned using the patterned photo resist layer 1017 as a mask by means of, for example, RIE, to achieve the final gate stacks. Specifically, the gate electrode layer 1016 is firstly patterned by means of, for example, RIE, to leave portions thereof corresponding to the final gate electrodes, and then the work function adjustment layer is patterned by means of, for example, RIE, to remove portions thereof exposed outside the gate electrode layer. Optionally, the gate dielectric layer 1002 may be patterned by means of, for example, RIE, to remove portions thereof exposed outside the gate electrode layer. It is to be noted that in this process the gate dielectric layer can be left as it is without-being patterned. In this case, the gate dielectric layer extends along the whole length of the respective fins, and has substantially no impact on the performances of the final devices.

It is to be noted that in FIG. 16(A) the isolation layer 1015 is not shown for clarity.

After the formation of the gate stacks, processes such as spacer formation, source/drain doping and activation, and metal contact formation can be conducted to achieve the final devices.

Thus, a SRAM cell according to an embodiment is achieved. As shown in FIG. 16, the SRAM cell may comprise a substrate, and a first FinFET and a second FinFET formed on the substrate. The first FinFET may comprise a first fin which is formed in a first region of a semiconductor layer provided on the substrate and abuts the semiconductor layer, and the second FinFET may comprise a second fin which is formed in a second region of the semiconductor layer and abuts the semiconductor layer. The semiconductor layer may comprise a plurality of semiconductor sub-layers. The first and second fins can be formed by different number of the semiconductor sub-layers, and thus can have different heights from each other.

More specifically, the SRAM cell may comprise 6 FETS, that is, a first pull-up PFET, a first pull-down NFET, a first pass gate NFET, a second pull-up PFET, a second pull-down NFET, and a second pass gate NFET. These 6 FETs can be connected with each other in the same manner as the conventional SRAM cell. Among the 6 FETs, the first pull-down NFET and the second pull-down NFET have a relatively larger fin height, while the remaining FETs have a relatively smaller fin height. Preferably, the fin height of each of the first pull-down NFET and the second pull-down NFET is twice the fin height of the remaining FETs.

In the above descriptions, details of patterning and etching of the layers are not described. It is understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. Accordingly, the technology is not limited except as by the appended claims.

We claim:

1. A Static Random Access Memory (SRAM) cell, comprising:
   a substrate;
   a semiconductor layer on the substrate, wherein the semiconductor layer comprises a plurality of stacked semiconductor sub-layers; and
   a first Fin Field Effect Transistor (FinFET) and a second FinFET formed on the substrate,
   wherein the first FinFET comprises a first fin, the first fin being formed of a first number of semiconductor sub-layers of the plurality of stacked semiconductor sub-layers in the semiconductor layer, and the first fin having a first height;
   wherein the second FinFET comprises a second fin, the second fin being formed of a second number of semiconductor layers of the plurality of stacked semiconductor sub-layers in the semiconductor layer, and the second fin having a second height, and wherein a total number of the first number of semiconductor sub-layers and a total number of the second number of semiconductor sub-layers are different from each other, the first fin and the second fin being located on different semiconductor sub-layers with different levels, and the first height of the first fin being different from the second height of the second fin, and wherein first adjacent semiconductor sub-layers in the first number of the plurality of stacked semiconductor sub-layers in the semiconductor layer comprise different materials, and have etching selectivity with respect to each other, and second adjacent semiconductor sub-layers in the second number of the plurality of stacked semiconductor sub-layers in the semiconductor layer comprise different materials, and have etching selectivity with respect to each other.

2. The SRAM cell according to claim 1, wherein the first number of the plurality of stacked semiconductor sub-layers of the first fin has a larger thickness than that of a first etching stop sub-layer of the first fin, and wherein the second number of the plurality of stacked semiconductor sub-layers of the second fin has a larger thickness than that of a second etching stop sub-layer of the second fin.

3. The SRAM cell according to claim 2, wherein the substrate comprises bulk Si, and the etching stop sub-layers comprise SiGe.

4. The SRAM cell according to claim 1, wherein the substrate comprises a bulk semiconductor substrate.

5. The SRAM cell according to claim 1, wherein at least one of the first fin and the second fin comprises a block region at a bottom of the at least one of the first fin and the second fin.

6. The SRAM cell according to claim 5, wherein for a p-type FinFET, the block region comprises n-type dopants, and for an n-type FinFET, the block region comprises p-type dopants.

7. The SRAM cell according to claim 1, wherein each of the first FinFET and the second FinFET comprises a gate stack crossing over a respective one of the first fin and the second fin, wherein the gate stack comprises a gate dielectric layer, a work function adjustment layer on the gate dielectric layer, and a gate electrode layer on the work function adjustment layer, wherein the work function adjustment layer and the gate electrode layer cover respective fin in a whole height of the respective fin, and wherein the gate electrode layer is separated from the semiconductor layer by an isolation layer.

8. The SRAM cell according to claim 7, wherein the isolation layer is formed by oxidizing a portion of the semiconductor layer close to a surface of the semiconductor layer.

9. The SRAM cell according to claim 7, wherein the isolation layer for the first FinFET has a substantially same thickness as the isolation layer for the second FinFET.

* * * * *